United States Patent [19]

Erickson et al.

[11] Patent Number: 4,830,622
[45] Date of Patent: May 16, 1989

[54] INTEGRATED CIRCUIT SOCKET AND BOARD

[76] Inventors: George Erickson, 3 Sunset Dr., Ipswich, Mass. 01938; Louis Rindone, Sr., 24 Myrtle Ave., Wakefield, Mass. 01880

[21] Appl. No.: 87,025

[22] Filed: Aug. 19, 1987

[51] Int. Cl.⁴ .............................................. H01R 1/00
[52] U.S. Cl. ..................................... 439/70; 439/525; 439/76
[58] Field of Search .................. 439/55, 68, 69, 70, 439/71, 72, 73, 525, 76; 174/52 FP, 52 S; 361/413, 421, 395, 392, 393, 394, 399

[56] References Cited

U.S. PATENT DOCUMENTS

| | | | |
|---|---|---|---|
| 3,622,950 | 11/1971 | Millinger | 439/70 |
| 4,192,565 | 3/1980 | Gianni | 439/70 |
| 4,312,555 | 1/1982 | Donaher et al. | 439/70 |
| 4,326,765 | 4/1982 | Brancelone | 439/69 |
| 4,428,633 | 1/1984 | Lundergan et al. | 439/70 |
| 4,460,236 | 7/1984 | Strauss | 439/70 |
| 4,478,476 | 10/1984 | Jones | 439/525 |

FOREIGN PATENT DOCUMENTS 2312915 12/1976 France ........................ 439/68

Primary Examiner—David Pirlot
Attorney, Agent, or Firm—Wolf, Greenfield & Sacks, P.C.

[57] ABSTRACT

An assembly for testing integrated packages comprising, a test circuit board for simultaneously testing a plurality of integrated circuit packages with each package having a plurality of rows of leads extending in parallel array from the body of the package, the board having a plurality of sockets each shaped with a top, sidewalls and a bottom with the top having means forming a plurality of rows of depending recesses spaced to receive, one each, the leads, and also having a plurality of auxiliary recesses, each positioned within the sidewalls and each shaped to receive a discrete component and each associated with one of the depending lead recesses, and means for electrically connecting discrete components within the auxiliary recesses and integrated circuit package leads in the associated depending lead recesses to each other and through the sockets to the circuit board, each discrete component being electrically connected to no more than one of the circuit package leads.

14 Claims, 2 Drawing Sheets

INTEGRATED CIRCUIT SOCKET AND BOARD

FIELD OF INVENTION

The present invention relates generally to a board for multiple testing of integrated circuit packages, and in particular to a socket arrangement for receiving integrated circuit packages for simultaneously use or testing on a test board.

BACKGROUND OF INVENTION

Integrated circuit packages are made in a variety of electronic configurations. These packages, however, are commonly configured within standard packages: one of these is often referred to as dual in-line packages, hereafter referred to as DIPS. These DIPS are used in a wide range of electronic applications, frequently including military apparatus. Because of the substantial reliability requirements of such DIPS, a variety of tests have been developed to assure proper functioning of these DIPS. These tests, including, for example, a burn in test required as a military prescreen, often involves the insertion of the chips into an "electrical circuit" for repetitive or other types of testing. In view of the very large number of DIPS tests, it has been common to develop a test board designed to simultaneously receive a plurality of DIPS for common and efficient testing. These test boards must be designed to receive a plurality of DIPS from automatic insertion machinery. After testing, the DIPS are automatically removed and a new set inserted. Consequently, the sockets designed to receive the DIPS must provide good electrical connections to the DIP leads and further must be designed to readily receive and securely hold the DIPS during the testing cycle. The contact between the socket and the DIP must be such as to permit easy insertion and removal, while nonetheless providing good electrical connections.

A wide-range of test boards are used to receive the many different types of DIPS. Thus, for example, the test boards used for memory DIPS are different from those used for logic DIPS. The circuit on these test boards are generally formed in the lower surface of the test board with some components such as capacitors and resistors secured on the other side of the board adjacent or in between the sockets designed to receive the DIPS. Heretofore, these sockets have ordinarily been secured by solder to a printed circuit board, and the associated electronic components, such as resistors and capacitors, are placed on the test board with their leads appropriately soldered to the test board circuit. Since these components occupy a portion of the test board surface, the remaining space left for sockets to receive the DIPS is limited. In turn, this means fewer DIPS can be tested at a given time.

Since testing and prescreening of DIPS require the use of expensive ovens with limited interior space, it is important to provide a test circuit board with as many sockets designed to receive DIPS as possible. By using smaller resistors, such as ceramic chip resistors, capacitors, or other passive components and by providing a socket particularly designed to receive both DIPS and one or more ceramic chip resistors or the like in lieu of axial resistors, a considerable space savings upon the surface of the printed circuit board may be effected. As a consequence more DIPS may be tested at a given time on a board.

Several attempts have been made to provide DIPS test boards that achieve these results. Insofar as the applicant is aware, the most relevant efforts are exemplified by U.S. Pat. No. 4,478,476 which issued Oct. 23, 1982 to Jones. That patent generally discloses a socket for use on a test board. However, it makes no provisions for the integration within the socket of means for receiving a discrete component such as a capacitor or resistor.

Other references illustrative of the prior art include, for example. U.S. Pat. No. 4,356,532 issued Oct. 26, 1982, U.S. Pat. No. 4,080,026 issued Mar. 21, 1968 and U.S. Pat. No. 4,116,519 issued Sept. 26, 1978.

Accordingly, it is an object of the present invention to provide a socket for securing DIPS to a circuit board including, but not limited to, test circuit baords.

A further object of the present invention is to provide an improved socket for a variety of circuit packages, such as DIPS, pin grid arrays, leadless chip carrier packages, flat packs, and the like that permits a more compact arrangement of the integrated circuit packages on the board.

A further object of the present invention is to provide an improved integrated circuit socket adapted to receive combinations of an integrated circuit package and a variety of discrete components for electrical connection of the components and integrated circuit package to the circuitry of a circuit board.

A futher object of the present invention is to provide a means for achieving greater flexibility in mounting an integrated circuit package on a circuit board by incorporating into the socket a means for receiving discrete components such as resistors and capacitors.

A further object of the present invention is to provide an improved circuit board having a plurality of sockets secured thereto in electrical contact with the circuit of the circuit board, wherein the sockets are adapted to commonly receive both integrated circuit packages and discrete passive components.

A still further object of the present invention is to provide an improved socket for receiving integrated circuit packages in a manner that permits ready insertion and removal of the packages into the socket, thereby permitting use of the sockets on a test board circuit.

Another object of this invention is to provide means for solderless secure components within a socket and in conductive contact with leads of an integrated circuit package.

SUMMARY OF INVENTION

The objects and advantages of the present invention, including those outlined above are achieved by the socket of the present invention, which, in a preferred form, includes a body having a plurality of rows of depending recesses extending downwardly from the top, with these recesses spaced and shaped to receive, one each, the leads of an integrated circuit package. Additionally, a plurality of auxiliary recesses, each shaped to receive a discrete passive component are each associated with one of the depending lead recesses. The socket is provided with two groups of leads with one group having an upper end projecting into the auxiliary recess for conductive engagement with discrete components positioned within the auxiliary recess. The other group of socket leads are connected to conductive spring members that are contained, one each, in the depending recesses for the integrated circuit package leads. These spring members are designed to frictionally engage the integrated circuit leads and provide an electrical connection to the discrete passive component and the circuitry of the printed circuit board.

The design of the present invention is shaped specifically to be compatible with existing "burn-in" style sockets and for use with automatic machinery that inserts and removes integrated circuit packages from test circuit baords. In this connection the depending recesses in the sockets are spaced and arranged to receive the footprint pattern of subtending leads of mounting pins of the integrated circuit packages. The height of the socket is such as to permit accommodation in the presently available testing ovens.

DESCRIPTION OF THE PREFERRED EMBODIMENT

Figure 1:
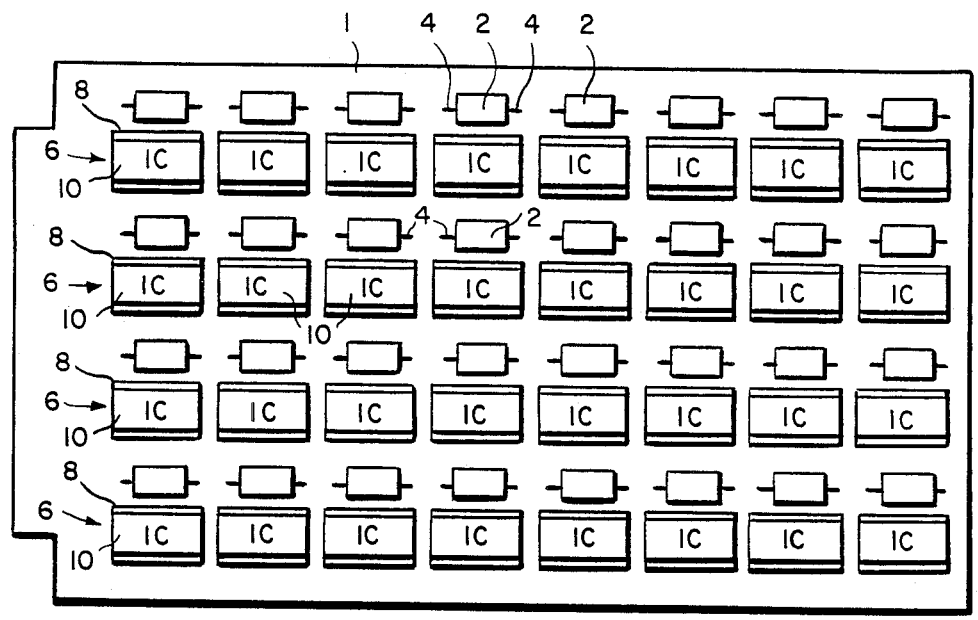
FIG. 1 is a plan view in schematic configuration of a test board embodying the invention.

Referring to FIG. 1, there is illustrated a plan view of a test board embodying the invention. In this arrangement, the test board 1 is conventionally formed with a suitable circuit for testing a multiplicity of integrated circuit packages. This circuit (not shown) may include large components such as capacitors having axial leads 4 which are conductively connected through the board to the circuit on the undersurface of the board. Additionally, the board 1 is provided with an array of rows 6 of individual sockets 8, each adapted to simultaneously receive similar integrated circuit chips 10.

Since resistors are integrally secured within the individual sockets 8, and therefore need not be separately mounted on the board 1 in a manner similar to capacitors 2, the configuration of board 1 may be arranged more compactly than would be the case with separate mounting of individual resistors. As illustrated in FIG. 1, the array of sockets 8 permits a greater number of parallel rows 6 of these sockets with spacing between them sufficient only for attachment of capacitors 2.

Figure 4:
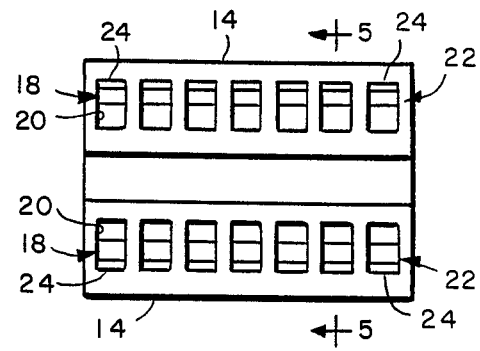
FIG. 4 is a top plan view of the socket component of the invention.
Figure 2:
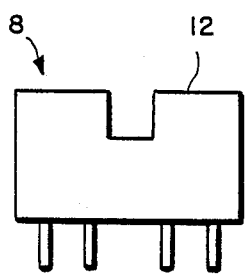
FIG. 2 is an end view of the socket component of the present invention.
Figure 3:
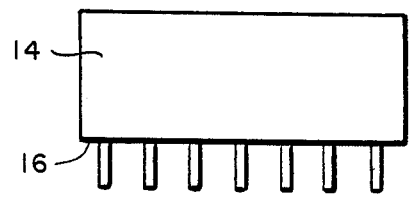
FIG. 3 is a side view of the socket component of the invention.
Figure 5:
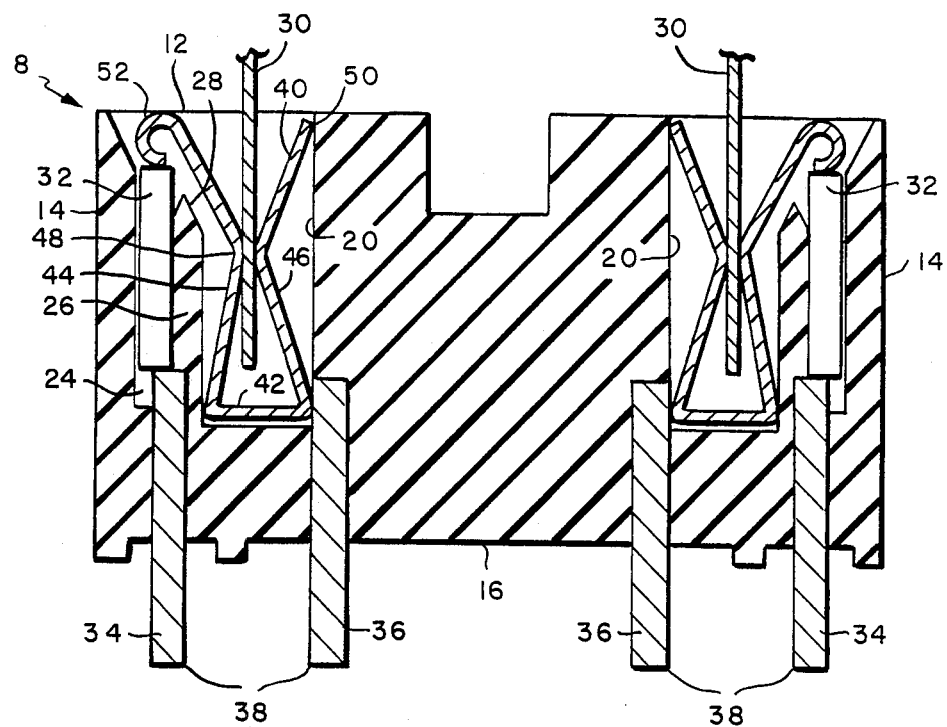
FIG. 5 is an enlarged cross-sectional view taken along the line 5—5 of FIG. 4.

The individual sockets 8 are illustrated in FIGS. 2, 3 and 4. As illustrated, the sockets are provided with a top 12, sidewalls 14 and bottom 16. A plurality of rows 18 of depending recesses 20 are formed in the top 12 of each socket. These recesses 20 are spaced to receive leads from the integrated circuit package. Additionally, a plurality of rows 22 of auxiliary recess 24 also depend from the top 12 of the socket 8. the auxiliary recesses 24 are each shaped to receive a discrete component such as a small resistor. Each auxiliary recess 24 is associated with one of the depending lead recesses 20 as best illustrated in FIG. 5. As illustrated in FIG. 5, the recesses 20 are separated from the auxiliary recesses 24 by a wall 26 that preferably has a beveled upper end 28 terminating short of the top 12. The recesses 20 are preferably rectangular in shape and are each positioned, sized and shaped to receive a depending lead of an integrated circuit package such as a DIP. The array of rows 18 are spaced with the individual recesses 20 also spaced to readily receive the array of integrated circuit package leads 30 that ordinarily form part of the integrated circuit packages being tested. In a typical arrangement the center leads of an integrated circuit packages are spaced apart 0.3 inches and accordingly, the center line of the adjacent recesses 20 are correspondingly spaced.

Each auxiliary recess 24 is shaped to receive a discrete component 32 which ordinarily would comprise a resistor forming a part of the test circuit. The discrete component 32 is secured within the auxiliary recess 24 with its lower end adapted to be conductively engaged by one lead 34 of a row of depending integrated circuit package leads 34. An additional set of rows of depending circuit leads 36 also extend downwardly from the bottom 16 of the socket. The lower ends 38 of the leads 34 and 36 are shaped, sized and positioned to extend through appropriate openings in the test board 1 for connection to the test circuit in a conventional manner.

The upper ends of leads 36 are conductively connected to the conductive spring 40. A conductive spring 40 is positioned within each of the depending recesses 20. The conductive spring 40 may be made of any conventional conductive spring material such as copper and includes a bight section 42 with a pair of upwardly extending arms 44 and 46. The upwardly extending arms are preferably formed with a constriction 48 intermediate the ends to provide a spring-like grip for any integrated circuit leads 30 that are inserted into the socket, thereby forming a conductive engagement with the leads of the integrated circuit being tested. The upper end of spring arm 46 bears against a wall of the recess 20 at 50. The other upwardly extending arm 44 above the construction 48 extends outwardly over beveled upper edge 28 into auxiliary recess 24. The upper end 52 of arm 44 is curled to form a conductive contact with the discrete component 32.

In operation individual integrated circuit packages are inserted one each in the array of sockets 8 as illustrated in FIG. 1. In this arrangement each integrated circuit package is conductively connected with its leads 30 engaging springs 40 which in turn conductively interconnects the discrete component 32 into the test board circuitry. Because of the arrangement, the integrated circuit package may be readily inserted and removed by automatic means, not shown.

We claim:

1. A socket for receiving an integrated circuit package having a body and a plurality of rows of projecting integrated circuit package leads from said body, the socket having sidewalls, a bottom and a top and comprising means forming a plurality of rows of depending recesses in said top, spaced to receive, one each, said leads, a plurality of auxiliary recesses each shaped to receive a discrete component and each associated with one of said lead recesses, first and second groups of socket leads, each lead of said first group having one end projecting outwardly from said bottom and the other end into an auxiliary recess for engagement with a discrete component, and each lead of said second group having one end projecting outwardly from said bottom and the other end into a depending recess, and a plurality of conductive springs secured, at least one each, in said depending recesses for conductive engagement with said leads of said second group and adapted to physically engage an integrated circuit package lead and a discrete component.

2. A socket as set forth in claim 1 wherein said leads of said package depend from said body and said rows of recesses and said auxiliary recesses depend from said top.

3. A socket as set forth in claim 2 wherein said socket has sidewalls and said auxiliary recesses are positioned within said socket sidewalls.

4. A socket as set forth in claim 3 having means defining said depending recess from said auxiliary recess.

5. A socket as set forth in claim 4 wherein said means defining said depending recess from said auxiliary recess comprises a wall having an upper end that terminates below said top.

6. A socket as set forth in claim 2 wherein said conductive spring comprises a U-shaped member having a bight section and upwardly extending arms with the upper end of one of said arms adapted to conductively engage a discrete passive component in an auxiliary recess.

7. A socket as set forth in claim 6 wherein said one arm extends into said auxiliary recess for pressure engagement only with said discrete passive component whereby said one arm secures and electrically contacts said component.

8. A socket as set forth in claim 7 wherein said means defining said depending recess from said auxiliary recess comprises a wall that extends upwardly and terminates below said top, and said one arm of said springs extends over said wall but below said top for engagement with said discrete component.

9. A socket as set forth in claim 8 wherein said leads projecting into said auxiliary recesses are positioned to conductively engage the bottom portion of a discrete passive component and the upper end of each of said one arms are positioned to conductively engage the upper end of a discrete passive component.

10. An assembly for testing integrated circuit packages comprising,
a test circuit board for simultaneously testing a plurality of integrated circuit packages with each package having a plurality of rows of leads extending in parallel array from the body of said package, said board having
a plurality of sockets each shaped with a top, sidewalls and bottom with the top having means forming a plurality of depending rows of recesses spaced to receive, one each, said leads, and also having a plurality of auxiliary recesses, each positioned within said sidewalls and each shaped to receive a discrete passive component and each associated with one of said depending lead recesses, and
means for electrically connecting discrete components within said auxiliary recesses and integrated circuit package leads in the associated depending lead recesses to each other and through said sockets to said test circuit board, each discrete component being electrically connected to no more than one of said circuit package leads.

11. An assembly as set forth in claim 10 wherein said means for electrically connecting comprises,
a plurality of socket leads arranged in two grous with each lead of one group having one end projecting outwardly from said bottom and the other end into an auxiliary recess for engagement with a discrete passive component, and each lead of said second group having one end projecting outwardly from said bottom and the other end into a depending lead recess, and a plurality of conductive springs secured one each in said depending recesses for conducting engagement with said leads of said second group and adapted to engage an integrated circuit package lead and a discrete component.

12. A socket as set forth in claim 11 having means defining said auxiliary recesses from said depending recesses, each comprising a wall having an upper end that terminates below said top, and said conductive spring comprises a U-shaped member with a bight section and upwardly extending arms, with the upper end of one of said arms extending over said wall adapted to conductively engage a discrete component in said auxiliary recess.

13. A socket for receiving an integrated circuit package and a plurality of discrete passive components wherein said socket has at least two groups of recesses with one group of recesses shaped, sized and positioned to receive leads of said package and a second group of recesses shaped, sized and positioned to receive said components, there being a recess of said first group corresponding to each recess of said second group, and means for selectively conductively connecting said leads and components in corresponding recesses entirely within said socket, each component being electrically connected to no more than one of said leads.

14. A socket for receiving one or more first electronic components each of which first components has a plurality of leads extending therefrom, and a plurality of second leadless electronic components, each of said second electronic components having at least first and second conductive contract points, the socket comprising:
a first group of recesses, each adapted to receive a lead of said first electronic components;
a first lead extending at one end into each of said first recesses and adapted for electrical contact with a first component lead therein, and extending at its other end from the socket;
a second group of recesses, each adapted to receive a second component;
a second lead extending at one end into each of said second recesses and adapted to make electrical contact with a first contact point of a second component therein, and extending at its other end from the socket; and
means for physically and conductively connecting a selected first component lead to said second contact point of each second component each component being electrically connected to no more than one of said leads.

* * * * *